(12) United States Patent
Goodman (10) Patent No.: US 7,982,277 B2
(45) Date of Patent: Jul. 19, 2011

(54) HIGH-EFFICIENCY THINNED IMAGER WITH REDUCED BORON UPDIFFUSION

(75) Inventor: Lawrence Alan Goodman, Plainsboro, NJ (US)

(73) Assignee: SRI International, Menlo Park, CA (US)

( * ) Notice: Subject to any disclaimer, the term of this patent is extended or adjusted under 35 U.S.C. 154(b) by 163 days.

(21) Appl. No.: 12/464,979

(22) Filed: May 13, 2009

(65) Prior Publication Data

US 2009/0294804 A1    Dec. 3, 2009

Related U.S. Application Data

(60) Provisional application No. 61/057,363, filed on May 30, 2008.

(51) Int. Cl.
*H01L 31/00* (2006.01)

(52) U.S. Cl. ............. 257/447; 257/E21.566; 257/E21.1; 257/358; 257/481; 257/460; 257/347; 257/229

(58) Field of Classification Search ........... 257/E21.566, 257/E21.1, 460, 347, 229, 447, 428
See application file for complete search history.

(56) References Cited

U.S. PATENT DOCUMENTS

| | | | |
|---|---|---|---|
| 6,498,073 B2 * | 12/2002 | Sarma et al. | 438/459 |
| 6,995,427 B2 * | 2/2006 | Aulnette et al. | 257/345 |
| 7,012,009 B2 * | 3/2006 | Lee et al. | 438/312 |
| 7,122,095 B2 * | 10/2006 | Letertre et al. | 156/344 |
| 7,232,743 B2 * | 6/2007 | Aulnette et al. | 438/478 |
| 7,238,583 B2 * | 7/2007 | Swain et al. | 438/358 |
| 7,404,870 B2 * | 7/2008 | Letertre et al. | 156/257 |
| 2005/0070076 A1 * | 3/2005 | Dion | 438/478 |
| 2006/0105559 A1 * | 5/2006 | Chen et al. | 438/607 |
| 2006/0186560 A1 * | 8/2006 | Swain et al. | 257/E27.133 |

* cited by examiner

*Primary Examiner* — Wai-Sing Louie
*Assistant Examiner* — Bilkis Jahan
(74) *Attorney, Agent, or Firm* — Lowenstein Sandler PC (57) ABSTRACT

A method for fabricating a back-illuminated semiconductor imaging device on an ultra-thin semiconductor-on-insulator wafer (UTSOI) is disclosed. The UTSOI wafer includes a mechanical substrate, an insulator layer, and a seed layer. At least one dopant is applied to the semiconductor substrate. A first portion of an epitaxial layer is grown on the seed layer. A predefined concentration of carbon impurities is introduced into the first portion of the epitaxial layer. A remaining portion of the epitaxial layer is grown. During the epitaxial growth process, the at least one dopant diffuses into the epitaxial layer such that, at completion of the growing of the epitaxial layer, there exists a net dopant concentration profile which has an initial maximum value at an interface between the seed layer and the insulator layer and which decreases monotonically with increasing distance from the interface within at least a portion of at least one of the semiconductor substrate and the epitaxial layer.

9 Claims, 9 Drawing Sheets

HIGH-EFFICIENCY THINNED IMAGER WITH REDUCED BORON UPDIFFUSION

CROSS-REFERENCE TO RELATED APPLICATIONS

This application claims the benefit of U.S. provisional patent application No. 61/057,363 filed May 30, 2008, the disclosure of which is incorporated herein by reference in its entirety.

FIELD OF THE INVENTION

The field of the invention is semiconductor device fabrication, and more specifically, the fabrication of back-illuminated semiconductor imaging devices having a monotonically decreasing doping profile for driving charge carriers to the front of the imaging devices.

BACKGROUND OF THE INVENTION

Thinned, back illuminated, semiconductor imaging devices are advantageous over front-illuminated imagers for high fill factor and better overall efficiency of charge carrier generation and collection. A goal of the operation of such devices is for the charge carriers generated by light or other emanation incident on the backside to be driven to the frontside quickly to avoid any horizontal drift which may smear the image. It is also desirable to minimize the recombination of the generated carriers before they reach the front side, since such recombination reduces overall efficiency and sensitivity of the device.

Such desirable features may be achieved by providing a thin semiconductor layer and a high electric field within this layer. The field should extend to the back surface, so that the generated carriers, such as electrons or holes, can be driven quickly to the front side. U.S. Pat. No. 7,238,583 by Swain et. al. (the "'583 patent"), which is incorporated herein by reference in its entirety, describes a method for producing a back-illuminated imaging device that exhibits the desired internal electric field. The device of the '583 patent also employs ultra-thin Silicon-on-Insulator (UTSOI) technology for providing a semiconductor substrate on which the back-illuminated imager is constructed. The practical work flow for using the method of described in the '583 patent in production is shown in FIG. 1.

Figure 1:
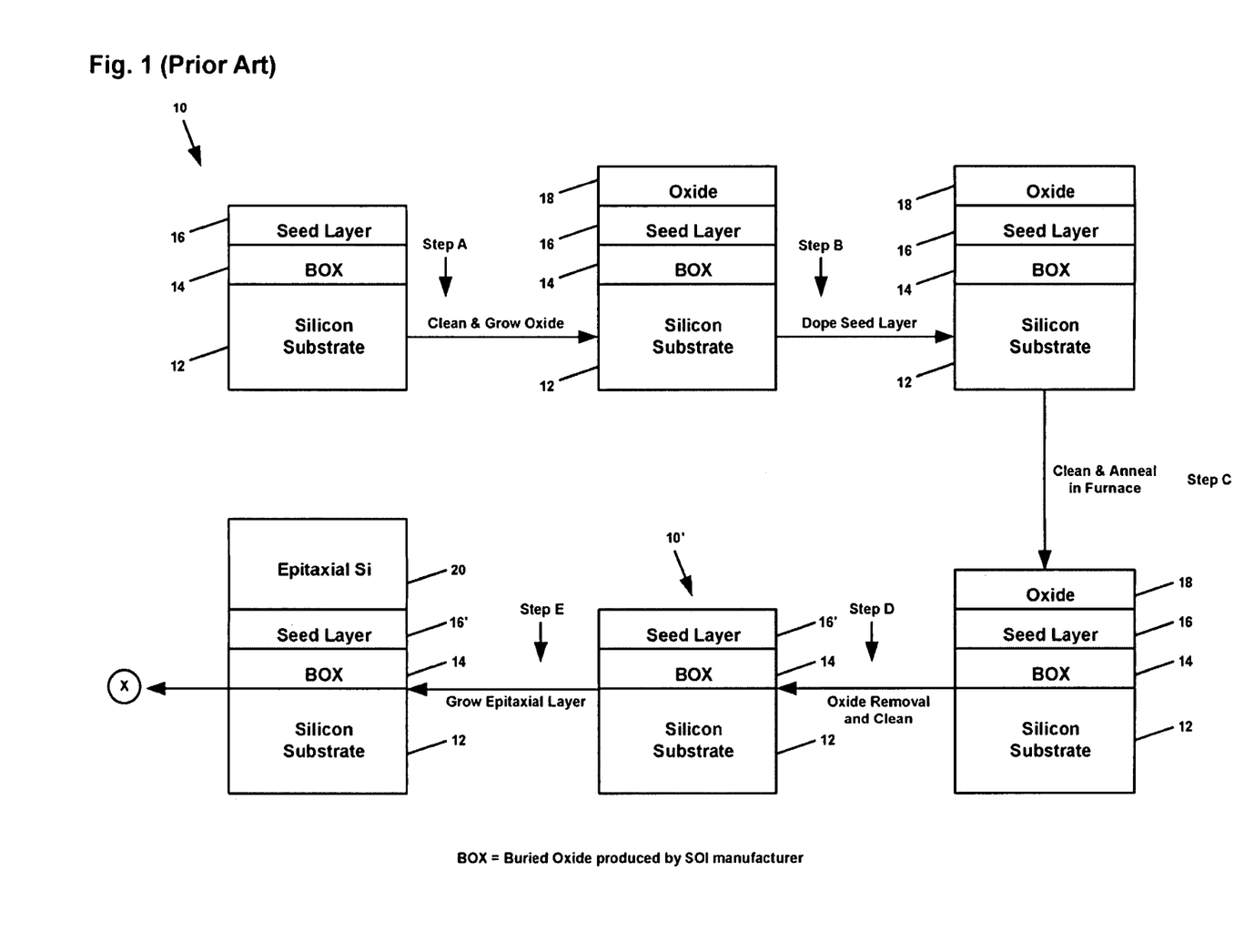
FIG. 1 shows a process for fabricating a back-illuminated imaging device on a UTSOI substrate in accordance with the '583 patent.

In FIG. 1, the starting structure is an initial substrate 10, sometimes referred to in the art as a UTSOI substrate. The starting UTSOI substrate 10 is composed of a mechanical substrate 12 (handle wafer) configured to provide mechanical support during processing, an insulator layer 14 (which can be, for example, a buried oxide layer of silicon (BOX)), and a semiconductor substrate 16 (also referred to as the "seed layer"). In Step A, the UTSOI wafer 10 is cleaned and then an oxide layer 18 is grown overlying the seed layer 16 opposite the mechanical substrate 12. In Step B, the seed layer 16 is doped. Dopants are introduced into the seed layer 16 in sufficient concentration to produce a desired net doping profile. The initial net doping concentration in the seed layer 16 may be on the order of $10^{17}$ charge carriers per cubic centimeter or higher, and may be either p-type or n-type. Common dopants include boron, phosphorous, antimony, and arsenic.

In the specific case where the semiconductor is silicon, the '583 patent cites boron as the most suitable dopant for producing p-type regions. In this example, the boron dopant is incorporated within the semiconductor before the growth of the epitaxial layer. Although the '583 patent outlines several techniques for introducing the boron dopant, the preferred method for introduction of p-type dopants is through the use of ion-implantation. With reference to this example, in Step B, ions of boron are implanted ballistically through the oxide layer 18 into the seed layer 16 of UTSOI wafer 10.

In Step C, the UTSOI wafer 10 is cleaned and annealed in a furnace to remove the damage introduced by the ion implantation of dopants, i.e., broken bonds are reformed and dopants are incorporated at lattice sites. In Step D, the oxide layer 18 is removed and the resulting doped wafer 10' is cleaned. In Step E, an epitaxial layer 20 is grown overlying doped semiconductor substrate 16, using semiconductor substrate 16 as the template. The epitaxial layer 20 provides a layer for fabricating front side components which complete the overall imaging device. Still referring to FIG. 1, during the growth of epitaxial layer 20, dopants previously introduced into the seed layer 16 diffuse into the epitaxial layer 20 as a result of processing at or above 1000° C. At the conclusion of the growth of the epitaxial layer 20, the net doping profile is very close to the desired profile, in that at each distance from interface 22 between the insulator layer 14 and the seed layer 16, within the seed layer 16 and epitaxial layer 20, the net carrier concentration is close to its final desired value, as shown in FIG. 1B. All remaining steps in the process are then carried out at lower temperatures, so that relatively little diffusion of dopants takes place, and the profile is essentially unchanged at the end of the process.

In Step F, once the epitaxial layer 20 is grown, with the simultaneous formation of a desired dopant profile, one or more imaging components 24 may be fabricated using known methods of semiconductor fabrication, as shown in FIG. 1. These imaging components may include charge-coupled device (CCD) components, CMOS imaging components, photodiodes, avalanche photodiodes, phototransistors, or other optoelectronic devices, in any combination. Components 24 may include both CCD and CMOS components fabricated in separate areas of the epitaxial layer 20 using known masking methods. Also included may be other electronic components such as CMOS transistors, (not shown) bipolar transistors (not shown), capacitors (not shown), or resistors (not shown). One or more p-n junctions 26 of various depths may be formed during the fabrication of imaging components 24.

In Step G, the mechanical substrate 12 is removed. Once the fabrication of components 24 is complete, the mechanical substrate 12 is no longer needed to provide mechanical stability. Removal of the mechanical substrate 12 may also be desirable in order to allow the emanation being detected to reach the backside semiconductor. Removal of the mechanical substrate 12 may be accomplished by such methods as chemical etching, mechanical grinding, or a combination of these methods. With chemical etching, the mechanical substrate 12 may be removed selectively, without removing the insulator layer 14. Alternatively, at least a portion of the mechanical substrate 12 may be left in place (not removed) if the remaining portion at least partially transmits the radiation or particles being detected and imaged.

If the mechanical substrate 12 is entirely removed, the insulator layer 14 may be removed, either partially or entirely, by chemical or physical methods or a combination of the two methods. In one embodiment, the insulator layer 14 is made to act as an anti-reflection coating for electromagnetic waves having wavelengths in a predetermined range, thereby allowing more photons to reach, and be absorbed in, the semiconductor layers 16, 20. This may be accomplished by reducing thickness of the insulator layer 14 to a thickness which minimizes reflection in the predetermined wavelength range. The thickness may be determined by the wavelength range and the index of refraction of the material of the insulator layer 14 in this wavelength range.

After partially removing the insulator layer 14, one or more anti-reflective coating layers (e.g., zirconium oxide or bismuth oxide) (not shown) can be deposited on the insulation layer 14 to function as an overall anti-reflective coating stack for a desired range of wavelengths. In still other embodiments, the insulation layer 14 can be completely etched away, and one or more anti-reflective coating layers can be deposited on the seed layer 16 so as to function as an overall antireflective coating.

Figure 2:
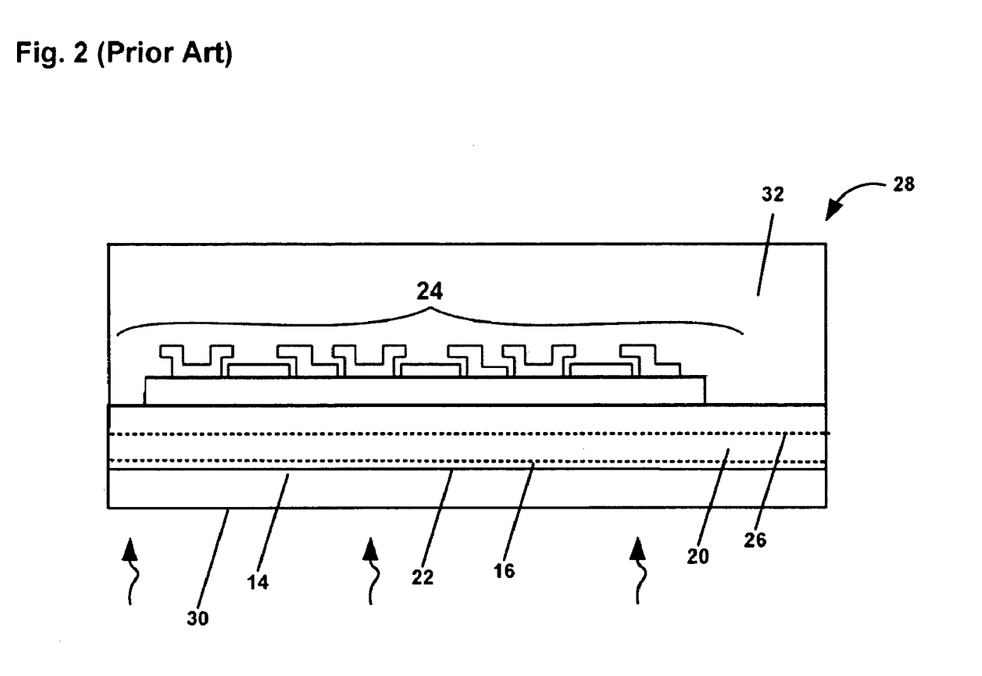
FIG. 2 shows a complete device structure according to the '583 patent.

FIG. 2 shows a complete laminated imaging device 28 as described in the '583 patent, with an anti-reflection coating 30. For thin devices, a sufficiently rigid lamination layer 32 may be added to provide mechanical stability. In FIG. 2 the lamination layer 32 is shown on the front side of the imaging device 28. Lamination layer 32 may be bonded to the front side of the wafer with cement after concluding the fabrication of imaging components 24 and other front-side components. Alternatively, the lamination layer may be bonded to the back of the imaging device 28. If the lamination layer 32 is bonded to the back of the imaging device 28, lamination layer material, any cement used to bond the lamination layer, and any other materials between the lamination layer 32 and the back of the imaging device 28 must be transparent to, and not degraded by, detected radiation.

Referring again to FIG. 1, a goal of the process for manufacturing a back-illuminated imaging device described in the '583 patent is the creation of a final net dopant concentration profile in semiconductor substrate 16 and epitaxial layer 20 which has a maximum value at the interface 22 between semiconductor substrate 16 and insulator layer 14. The final net dopant concentration profile after the epitaxial growth (i.e., Step E) decreases monotonically with increasing distance from the interface 22 within a portion of semiconductor substrate 16 and epitaxial layer 20 between interface 22 and p-n junctions 26 shown in FIG. 1 (p-n junctions 26 are created during fabrication of the front-side components 24). Such a profile may give rise to an electric field within semiconductor substrate 16 and epitaxial layer 20 tending to drive photogenerated electrons toward the front side imaging components 24 and minimizing the trapping of these electrons near the backside.

One of the concerns expressed about high-resolution imaging devices made using technology that is similar to that disclosed in the '583 patent is that boron doping diffuses too far from the seed layer 16 into and through the lightly doped epitaxial layer 20 before and during the fabrication of the imaging components 24. Although the resulting device produces a desired monotonically decreasing doping profile in the seed layer 16 and the epitaxial layer 20, the resulting profile may have a slope that is too gradual, resulting in reduced performance of the imager With regard to light sensitivity and spatial resolution. There are cases where a more abrupt transition from heavy doping to uniform doping is an advantage.

Accordingly, what would be desirable, but has not yet been provided, is a method and resulting device for producing imagers that exhibit a more abrupt doping profile as compared to prior art devices.

SUMMARY OF THE INVENTION

The above-described problems are addressed and a technical solution achieved in the art by providing a method for fabricating a semiconductor device, the method comprising the steps of: providing a wafer comprising: a mechanical substrate, an insulator layer substantially overlying the mechanical substrate, and a seed layer substantially overlying the insulator layer; applying at least one dopant to the seed layer; growing a first portion of an epitaxial layer on the seed layer; introducing a predefined concentration of carbon impurities into the first portion of the epitaxial layer; and growing a remaining portion of the epitaxial layer, wherein at least one dopant diffuses into the epitaxial layer such that, at completion of the growing of the epitaxial layer, there exists a net dopant concentration profile which has an initial maximum value at an interface between the seed layer and the insulator layer and which decreases monotonically with increasing distance from the interface within at least a portion of at least one of the seed layer and the epitaxial layer. The net dopant concentration profile may have a slope which decreases monotonically at a first average rate within the seed layer, and decreases monotonically at a second average rate that is faster than the first average rate within the first portion of the epitaxial layer. The net doping concentration may meet a background doping concentration substantially within the epitaxial layer.

In a preferred embodiment, the first portion of the epitaxial layer may have a thickness in the range of about 0.1 μm to 1.0 μm. The predefined concentration of carbon impurities introduced into the first portion of the epitaxial layer may be in the range of 1E19-1E21/cc. The carbon impurities may be introduced by means of one of chemical vapor deposition and ion implantation. The at least one dopant may be at least one of boron, phosphorous, indium and gallium.

The method may further comprise the step of fabricating at least one imaging component in the epitaxial layer. The at least one imaging component may be at least one of a CMOS imaging component, a charge-coupled device component, a photodiode, an avalanche photodiode, and a phototransistor.

The method may further comprise the step of removing a portion of the mechanical substrate such that the thickness of the remaining mechanical substrate functions as an anti-reflection coating for electromagnetic radiation. The method may further comprise the step of removing a portion of the insulator layer following complete removal of the mechanical substrate such that the thickness of the remaining insulator layer functions as an anti-reflection coating for electromagnetic radiation.

The resulting semiconductor device includes an insulator layer; a seed layer substantially overlying and having an interface with the insulator layer; and an epitaxial layer grown substantially overlying the seed layer by epitaxial growth, the epitaxial layer having a first portion adjacent to the seed layer and a remaining portion adjacent to the first portion and distal to the semiconductor substrate; wherein the first portion of the epitaxial layer is doped with carbon impurities and wherein the seed layer and the epitaxial layer exhibit a net doping concentration having a maximum value at the interface between the seed layer and the insulator layer and decreasing monotonically with increasing distance from the interface within at least a portion of at least one of the seed layer and the epitaxial layer.

BRIEF DESCRIPTION OF THE DRAWINGS

The present invention may be more readily understood from the detailed description of an exemplary embodiment presented below considered in conjunction with the attached drawings and in which like reference numerals refer to similar elements and in which.

It is to be understood that the attached drawings are for purposes of illustrating the concepts of the invention and may not be to scale.

DETAILED DESCRIPTION OF THE INVENTION

Figure 3:
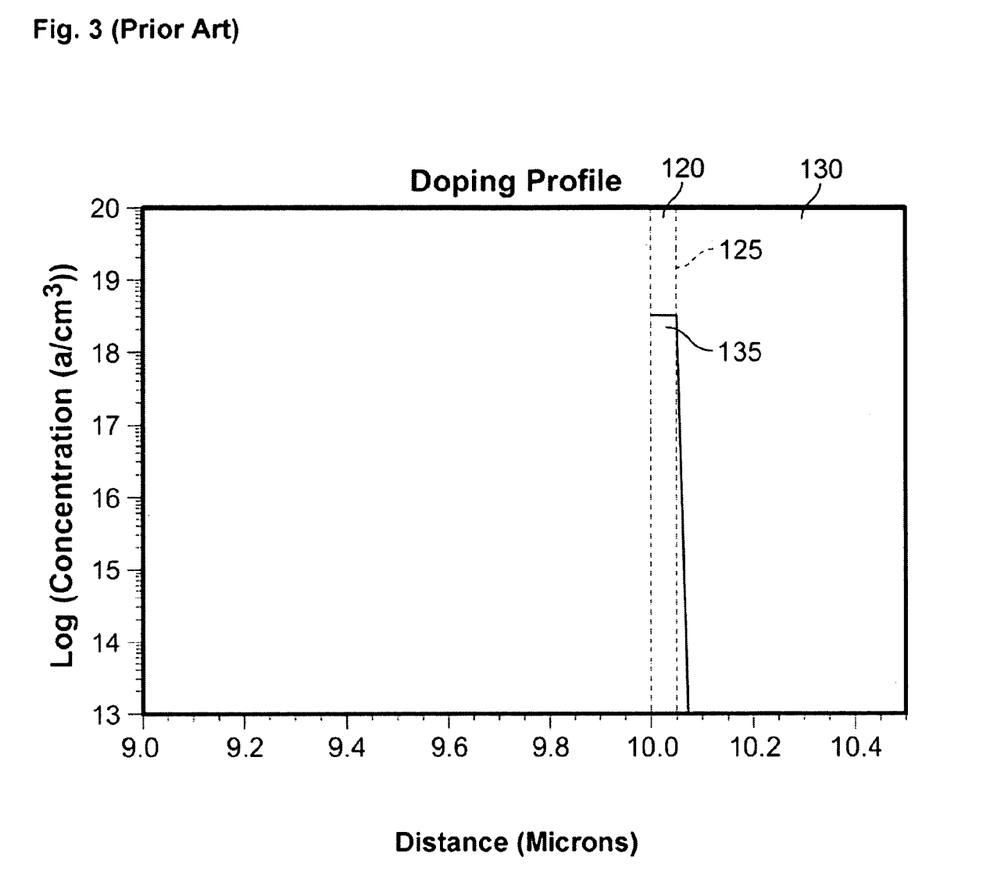
FIG. 3 shows an initial doping profile in a semiconductor substrate as described in the '583 patent.
Figure 4:
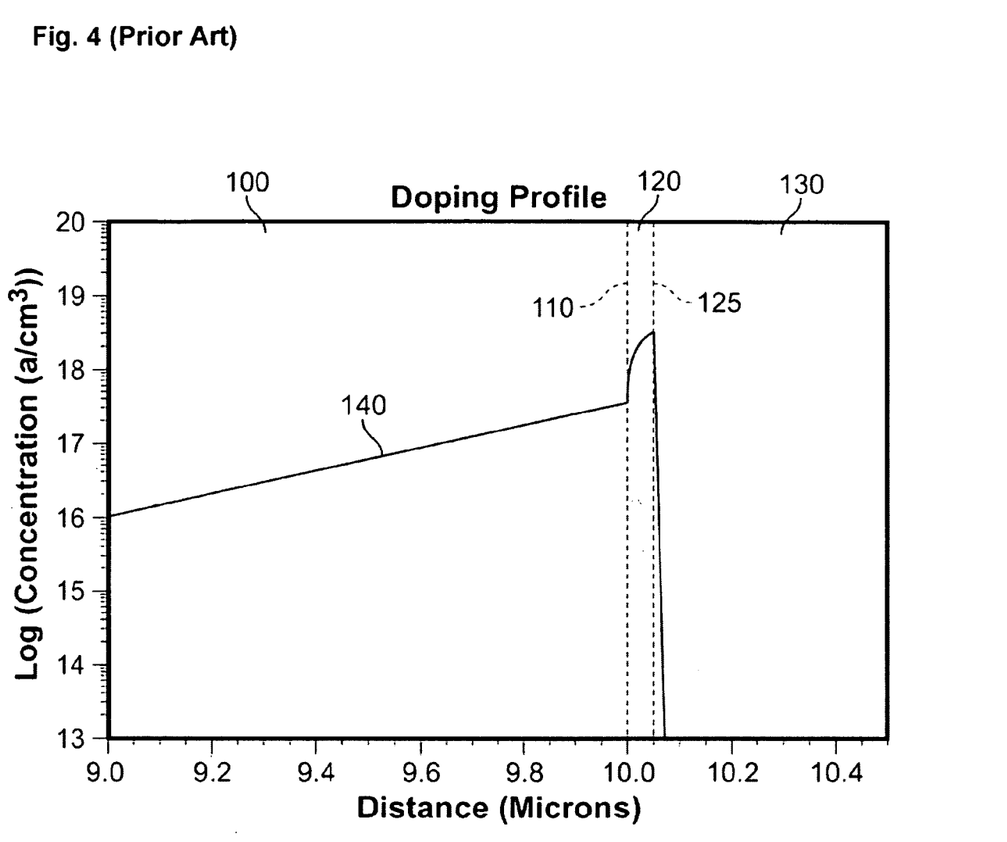
FIG. 4 shows a doping profile following growth of an epitaxial layer as described in the '583 patent.
Figure 5:
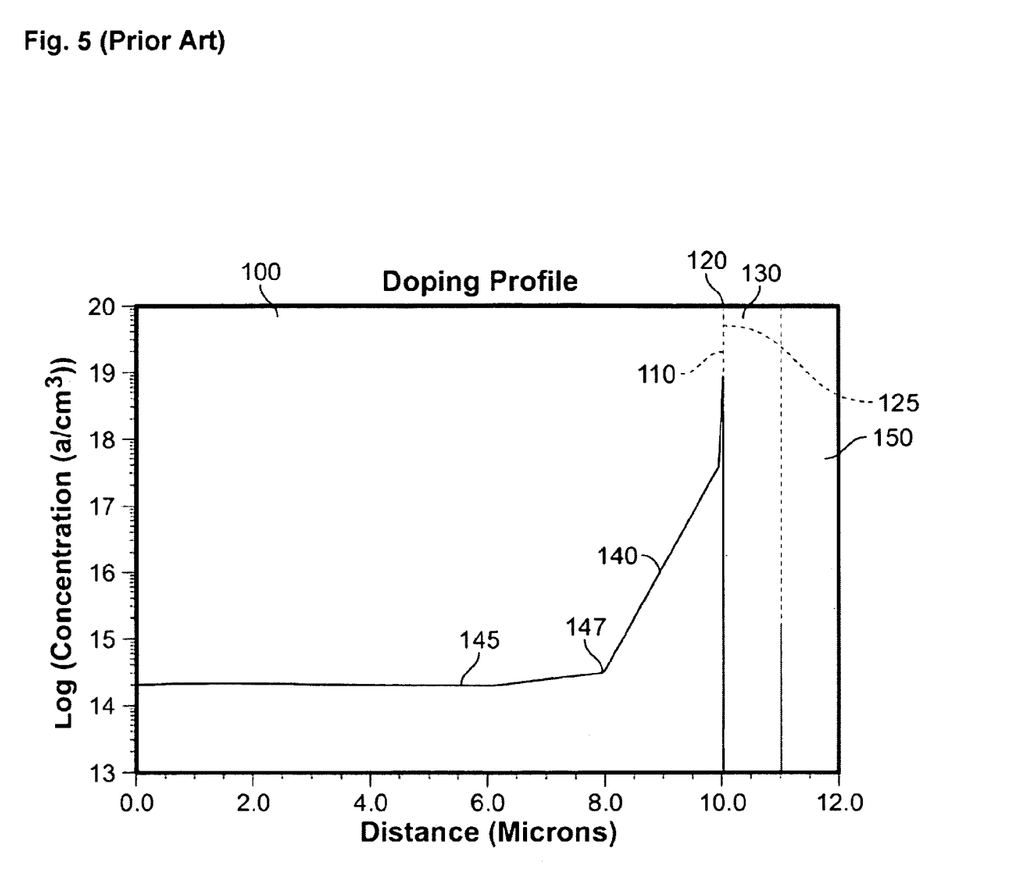
FIG. 5 shows the doping profile of FIG. 3 on a larger distance scale as described in the '583 patent.

Processing parameters such as doping levels, initial doping profiles, and temperatures are chosen to give a desired doping profile. FIGS. 3 through 5, reproduced from the '583 patent, illustrate the results of computer simulations of desired net doping profiles. In these figures, various regions correspond to regions of the structures shown in FIG. 1, as follows:

Region 150 (FIG. 5) corresponds to the mechanical substrate 12; Region 130 (FIGS. 3-5) corresponds to the insulator layer 14 comprising an oxide of silicon; Region 120 (FIGS. 3-5) corresponds to the seed layer 16 comprising silicon; Region 100 corresponds to the epitaxial layer 20 comprising silicon; Reference number 125 corresponds to the interface 22 between the seed layer 16 and the insulator layer 14; and Reference number 110 corresponds to an interface between the seed layer 16 and the epitaxial layer 20.

FIG. 3 shows an initial doping profile 135 in the seed layer 120, before growth of the epitaxial layer 100, according to the '583 patent. Boron is used as the dopant, and it may be introduced into semiconductor substrate 120 by any of the methods for introducing dopants described above. Initial profile 135 is created by boron doping (or, equivalently, net p-type doping) with a net p-type concentration of about $1 \times 10^{19}$ carriers per cubic centimeter, assumed uniform through semiconductor substrate 220.

FIG. 4 shows a net final doping profile 140 after growth of epitaxial layer 100, according to the '583 patent. The net final doping profile 140 in this embodiment is p-type; alternatively it could be n-type. Boron atoms starting in the seed layer 120 diffuse into epitaxial layer 100 during growth of that layer to produce what may become essentially net final doping profile 140, as discussed above. The net final doping profile 140 in this simulated process exhibits the following desirable features: it has a maximum value at interface 125 of the seed layer 120 and the insulator layer 130 and decreases monotonically with increasing distance from interface 125 within one of the seed layer 120 and epitaxial layer 100.

FIG. 5 shows the same doping profile as FIG. 4 on a larger scale of distance, in order to show essentially the entire profile. At some distance from the interface 125 the net final doping profile 140 meets the background doping level 145 in the epitaxial layer 100. The doping level remains at this concentration level 145 all the way to the junctions (not shown in FIG. 5). As long as net doping concentration 140, 145 does not increase with distance away from interface 125, carriers generated in the seed layer 120 or epitaxial layer 100 by electromagnetic waves or particles incident on the backside may tend to be driven toward front side imaging components (not shown) and not in the opposite direction.

Figure 6:
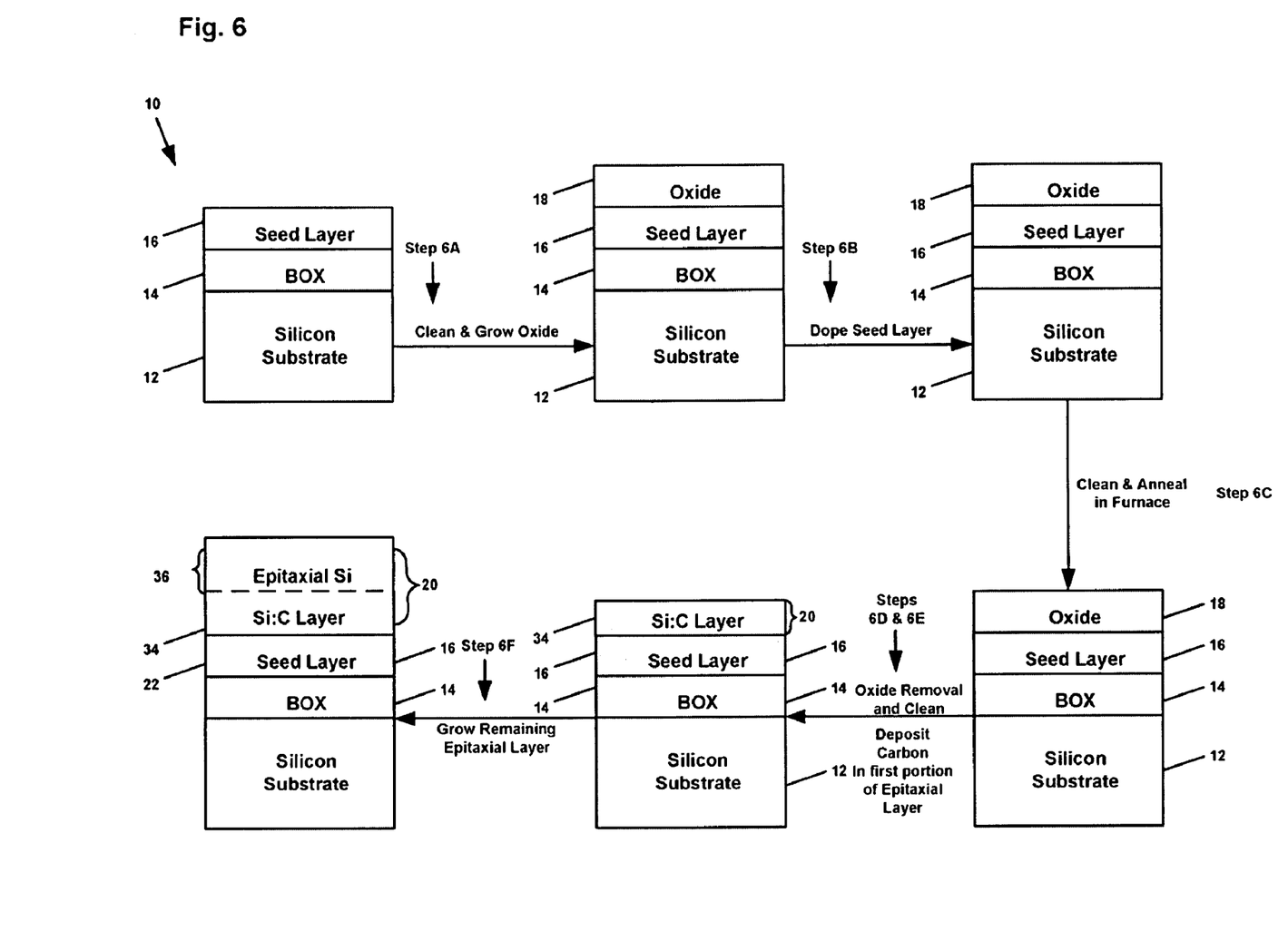
FIG. 6 is a block diagram illustrating the steps of manufacturing a back illuminated imager based on an ultra-thin silicon-on-insulator starting wafer wherein carbon impurities are introduced into the epitaxial layer at the start of the epitaxial growth cycle, constructed in accordance with an embodiment of the present invention.
Figure 7:
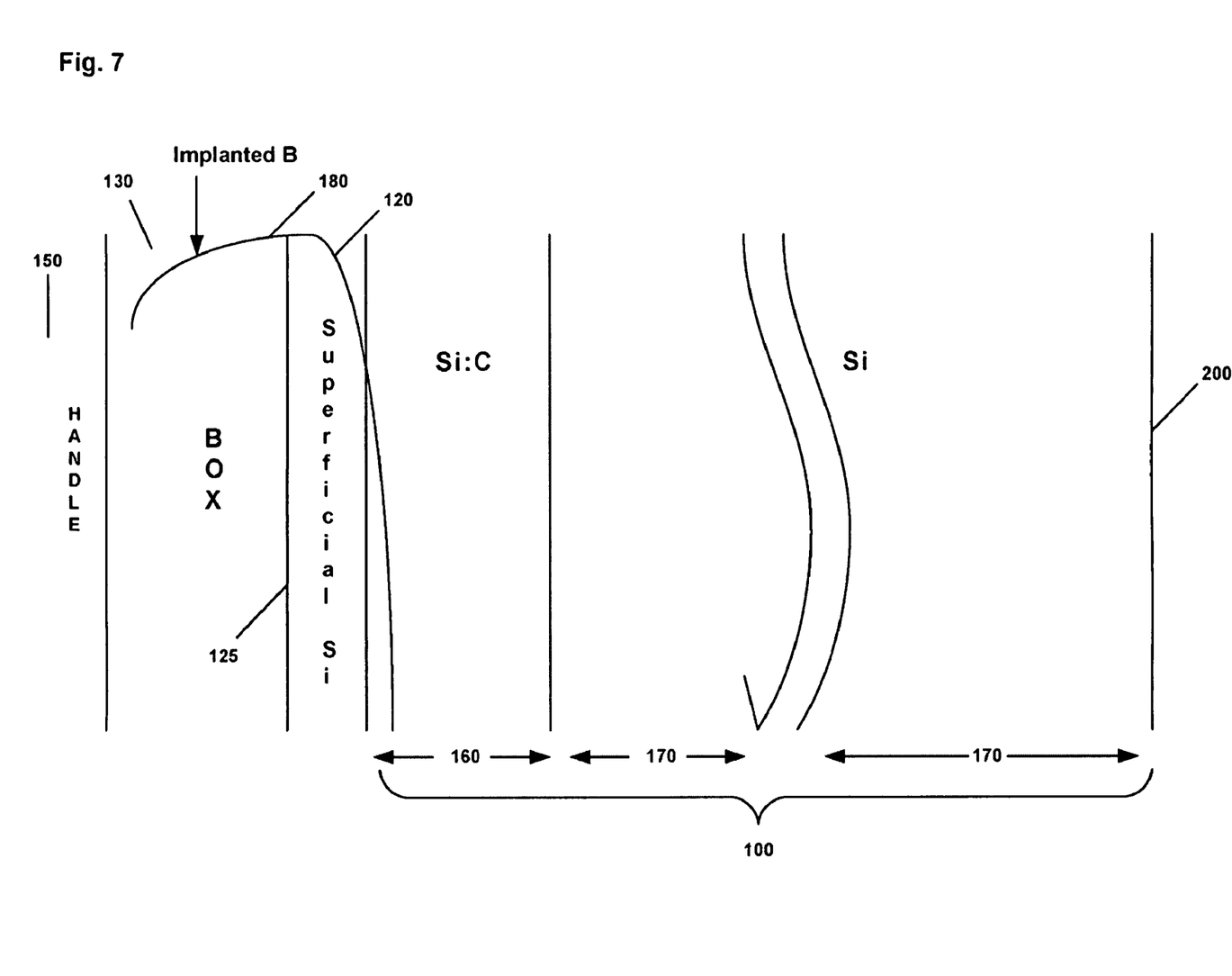
FIG. 7 shows a doping profile of a UTSOI imager manufactured according to the process illustrated in FIG. 6 after growth of the epitaxial layer but before thermal processing.
Figure 8:
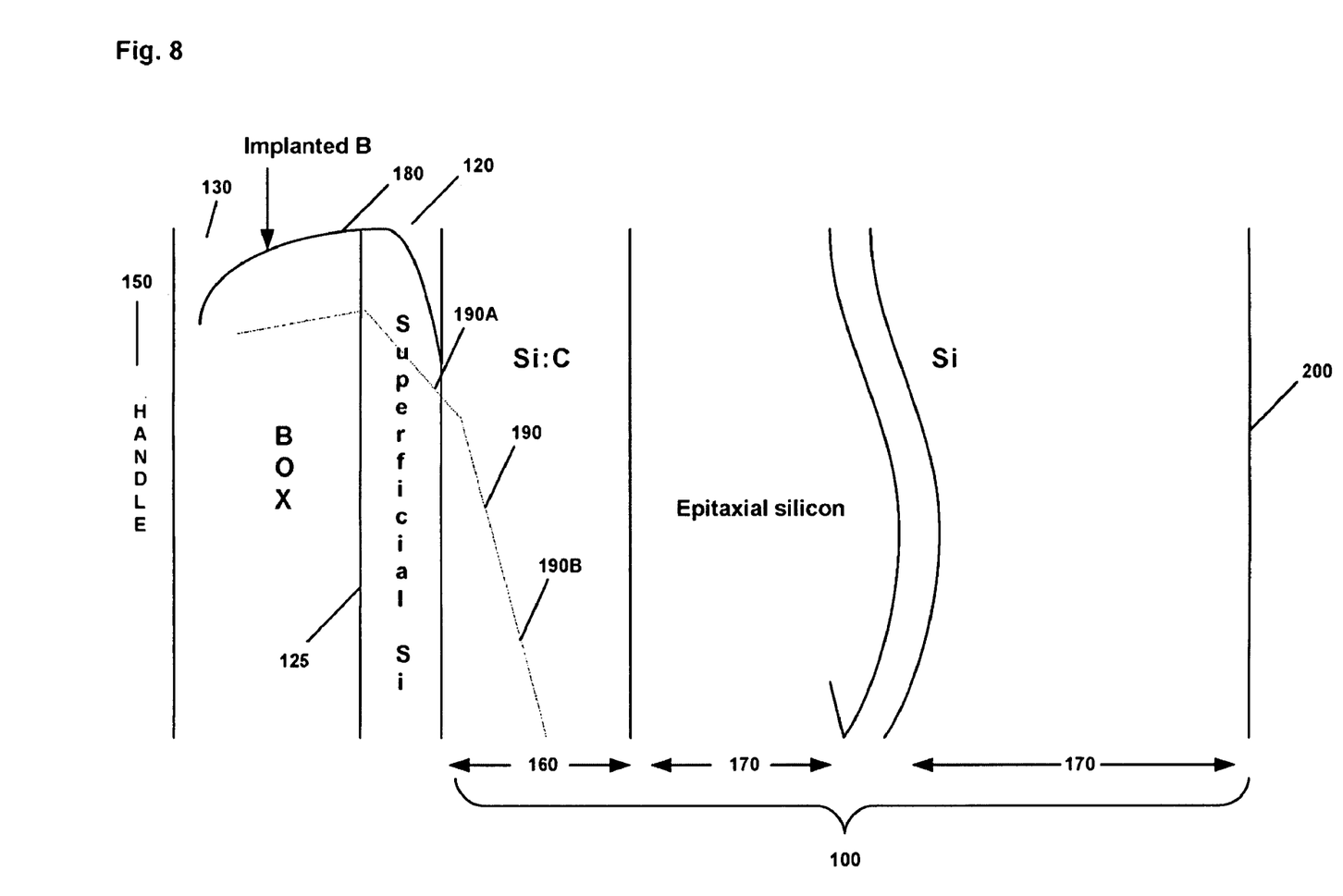
FIG. 8 shows a doping profile of a UTSOI imager manufactured according to the process illustrated in FIG. 6 after thermal processing.

The following embodiments of illustrative methods for manufacturing a back illuminated imager as depicted in FIGS. 6-8 produce a more abrupt doping profile than that disclosed in the '583 patent. In FIGS. 6-8, the steps of fabricating one or more imaging components in the epitaxial layer, removing the mechanical substrate, creating optional anti-reflection layers/coatings, and adding a lamination layer are omitted from the diagrams, but optionally may be employed.

Referring now to FIG. 6, steps for manufacturing a back-illuminated imager based on a UTSOI wafer 10 according to an embodiment of the present invention is depicted. In Step 6A, the UTSOI wafer 10 is cleaned and then an oxide layer 18 is grown overlying the seed layer 16 opposite the mechanical substrate 12. In Step 6B, the seed layer 16 is doped. Dopants are introduced into the seed layer 16 in sufficient concentration to produce a desired net doping profile. The initial net doping concentration in the seed layer 16 may be on the order of 10 17 charge carriers per cubic centimeter or higher, and may be either p-type or n-type. Common dopants include boron, phosphorous, antimony, arsenic, indium and gallium.

In the specific case where the semiconductor is silicon, the '583 patent cites boron as the most suitable dopant for producing p-type regions. The boron dopant is incorporated within the semiconductor before the growth of the epitaxial layer 20. The boron dopant is introduced into the seed layer 16 (i.e., the superficial Si layer 16) by means of chemical vapor deposition, ion implantation, or other suitable method. In a preferred embodiment, ion implantation is used for introducing dopants. Continuing with Step 6B, ions of boron are implanted ballistically through the oxide layer 18 into the seed layer 16 of the UTSOI wafer 10.

In Step 6C, the UTSOI wafer 10 is cleaned and annealed in a furnace to remove the damage introduced by the ion implantation of dopants, i.e., broken bonds are reformed and dopants are incorporated at lattice sites.

In Step 6D, the oxide layer 18 is removed and the resulting doped wafer 10' is cleaned. In Step 6E, a first portion 34 of the epitaxial layer 20 is grown overlying doped seed layer 16', using the seed layer 16 as the template. The first portion 34 comprises a silicon crystal layer doped with a predefined percentage of carbon as a thin film (i.e., the Si:C layer 34). The Si:C layer 34 of the epitaxial layer 20 has a preferred thickness in the range of about 0.1 μm to 1.0 μm. A predefined amount (in the range of 1e19-1e21/cc) of carbon may be introduced at the beginning of the growth of the epitaxial layer 20 by means of chemical vapor deposition, i.e., the first portion 34 of the epitaxial layer 20 is exposed to a carbon-containing gas which is shut off after a predetermined amount of time when the first portion 34 reaches the predetermined thickness. Alternatively, in Step 6E, the first portion 34, comprising preferably silicon, can be grown on the highly boron-doped seed layer 16' to a thickness of no more than about one micron. Then the wafer 10' may be taken out of the epitaxial growth machine and carbon can be introduced by ion implantation followed by suitable annealing to incorporate carbon into the first portion 34 of the epitaxial layer 20. The wafer 10' may then be put back into the epitaxial growth machine.

In Step F, a remaining portion 36 of the epitaxial layer 20 is grown substantially overlying the first portion 34. Still referring to FIG. 6, during the growth of the remaining portion 36 of the epitaxial layer 20, the boron dopant previously introduced into the seed layer 16' diffuse into epitaxial layer 20 as a result of processing at or above 1000° C. At the conclusion of the growth of the epitaxial layer 20, the net doping profile is very close to the desired profile, in that at each distance from interface 22 between the insulator layer 14 and the seed layer 16, within one of the seed layer 16 and epitaxial layer 20, the net carrier concentration is close to its final desired value. All remaining steps in the process are then carried out at lower temperatures, so that relatively little diffusion of dopants takes place, and the profile is essentially unchanged at the end of the process.

FIG. 7 shows a doping profile with the Si:C layer 34 grown according to the method of FIG. 6 before thermal processing. FIG. 8 shows a doping profile grown according to the method of FIG. 6 after thermal processing. Region 150 corresponds to the mechanical substrate 12; Region 130 corresponds to the insulator layer 14; Region 120 corresponds to the seed layer 16 (i.e., the superficial Si layer) comprising silicon; Region 100 corresponds to epitaxial layer 20; Region 160 corresponds to the first portion 34 of the epitaxial layer 20 containing carbon-doped silicon; Region 170 corresponds to the remaining portion 36 of the epitaxial layer 20; Reference number 180 corresponds to the initial boron dopant concentration profile before thermal processing, while reference number 190 corresponds to the final net boron concentration profile after thermal processing; Reference number 200 corresponds to the front surface of the wafer 10; and Reference number 125 corresponds to the interface 22 between the seed layer 16 and insulator layer 14.

In FIG. 7, the boron dopant profile 180 abruptly decreases in concentration when entering the region 160 containing carbon. In FIG. 8, after thermal processing, the slope of the net boron doping profile 190 decreases, but remains substantially confined to the region 160. In some embodiments, the net doping concentration meets a background doping concentration substantially within the region 160. The net boron doping profile 190 has a "dual" slope which decreases monotonically from the interface 125 at a first average rate (190A), and decreases monotonically at a second average rate (190B) that is faster than the first average rate substantially within the region 160.

Normally, processing conditions are such that boron up-diffuses in non-carbon doped imagers several microns toward the front surface 200 of the wafer 10. For relatively thick imaging layers, such an amount of up-diffusion may be acceptable, but, as imaging layers become thinner so as to achieve higher pixel density, an up-diffusion of about 1 micron may limit the performance of imager pixels. The presence of about a few percent or less (in the range of about 1e20-1E21/cc) in the Si:C layer 160 may reduce the diffusion coefficient of boron by up to one order of magnitude. This reduced boron diffusion thereby enables the fabrication of thinner, high-sensitivity silicon imaging layers using UTSOI technology.

It is to be understood that the exemplary embodiments are merely illustrative of the invention and that many variations of the above-described embodiments may be devised by one skilled in the art without departing from the scope of the invention. It is therefore intended that all such variations be included within the scope of the following claims and their equivalents.

What is claimed is:

1. A semiconductor device, comprising:
   an insulator layer;
   a seed layer substantially overlying and having an interface with the insulator layer; and
   an epitaxial layer grown substantially overlying the seed layer by epitaxial growth, the epitaxial layer having a first portion adjacent to the seed layer and a remaining portion adjacent to the first portion and distal to the seed layer;
   wherein the first portion of the epitaxial layer is doped with carbon impurities and
   wherein the seed layer and the epitaxial layer exhibit a net doping concentration having a maximum value at the interface of the seed layer and the insulator layer and decreasing monotonically with increasing distance from the interface within at least a portion of at least one of the seed layer and the epitaxial layer.

2. The semiconductor device of claim 1, wherein the net dopant concentration profile has a slope which decreases monotonically at a first average rate within the seed layer, and decreases monotonically at a second average rate that is faster than the first average rate within the first portion of the epitaxial layer.

3. The semiconductor device of claim 2, wherein the net doping concentration meets a background doping concentration substantially within the first portion of the epitaxial layer.

4. The semiconductor device of claim 1, wherein the first portion of the epitaxial layer has a thickness in the range of about 0.1 µm to 1.0 µm.

5. The semiconductor device of claim 1, wherein the predefined concentration of carbon impurities introduced into the first portion of the epitaxial layer is in the range of about 1E19-1E21/cc.

6. The semiconductor device of claim 1, wherein the at least one dopant is at least one of boron, phosphorous, indium and gallium.

7. The semiconductor device of claim 1, further comprising at least one imaging component fabricated in the epitaxial layer.

8. The semiconductor device of claim 7, wherein the at least one imaging component includes is at least one of a CMOS imaging component, a charge-coupled device component, a photodiode, an avalanche photodiode, and a phototransistor.

9. The semiconductor device of claim 1, wherein the thickness of the insulator layer has a thickness so as to function an anti-reflection coating for electromagnetic radiation.

* * * * *